United States Patent
Ta et al.

(10) Patent No.: US 9,515,684 B2
(45) Date of Patent: Dec. 6, 2016

(54) RECEIVER AND VOLTAGE CONTROLLED OSCILLATOR

(71) Applicant: KABUSHIKI KAISHA TOSHIBA, Minato-ku, Tokyo (JP)

(72) Inventors: Tuan Thanh Ta, Yokohama Kanagawa (JP); Akihide Sai, Kawasaki Kanagawa (JP); Masanori Furuta, Odawara Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/971,086

(22) Filed: Dec. 16, 2015

(65) Prior Publication Data

US 2016/0173137 A1 Jun. 16, 2016

(30) Foreign Application Priority Data

Dec. 16, 2014 (JP) .................. 2014-254066

(51) Int. Cl.
| | |
|---|---|
| *H04B 1/06* | (2006.01) |
| *H04B 1/00* | (2006.01) |
| *H03B 9/14* | (2006.01) |
| *H03F 3/19* | (2006.01) |
| *H04B 1/16* | (2006.01) |

(52) U.S. Cl.
CPC ............ *H04B 1/0007* (2013.01); *H03B 9/141* (2013.01); *H03F 3/19* (2013.01); *H04B 1/16* (2013.01); *H03F 2200/294* (2013.01)

(58) Field of Classification Search
CPC ......... H03B 9/141; H04B 1/16; H04B 1/0007; H03D 11/02

USPC .............. 455/254, 255, 139, 141, 164.2, 165.1, 455/182.1

See application file for complete search history.

(56) References Cited

U.S. PATENT DOCUMENTS

| | | | | |
|---|---|---|---|---|
| 5,822,704 A | * | 10/1998 | Ishii ................. | H04B 1/403 375/216 |
| 5,982,807 A | * | 11/1999 | Snell ................. | H04B 1/707 370/342 |
| 6,778,594 B1 | * | 8/2004 | Liu .................. | H03D 3/009 375/222 |

(Continued)

FOREIGN PATENT DOCUMENTS

| | | |
|---|---|---|
| JP | 2012175687 A | 9/2012 |
| WO | 2015025965 A1 | 2/2015 |

OTHER PUBLICATIONS

Kim, et al., "Analysis and Design of Voltage-Controlled Oscillator Based Analog-to-Digital Converter", IEEE Transactions on Circuits and Systems, vol. 57, No. 1, Jan. 2010.

*Primary Examiner* — Tuan Pham
(74) *Attorney, Agent, or Firm* — Holtz, Holtz & Volek PC

(57) ABSTRACT

According to an embodiment, a receiver includes a voltage controlled oscillator, a frequency-to-digital converter and an input sensitivity controller. In the voltage controlled oscillator, input sensitivity relative to a baseband signal is controlled based on an input sensitivity control signal. The voltage controlled oscillator oscillates at a frequency controlled by a voltage of the baseband signal to generate an oscillation signal. The frequency-to-digital converter performs frequency-to-digital conversion of the oscillation signal to generate a digital signal. The input sensitivity controller generates the input sensitivity control signal based on the digital signal.

8 Claims, 4 Drawing Sheets

(56) References Cited

U.S. PATENT DOCUMENTS

2009/0042527 A1* 2/2009 Niknejad ............. H04B 1/1027
455/234.2
2013/0127529 A1 5/2013 Morita

* cited by examiner

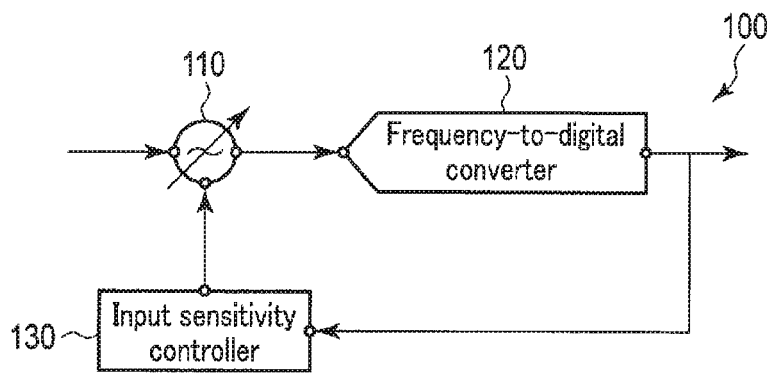
F I G. 1
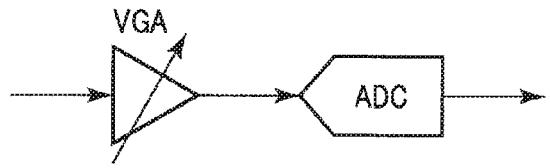
F I G. 2A
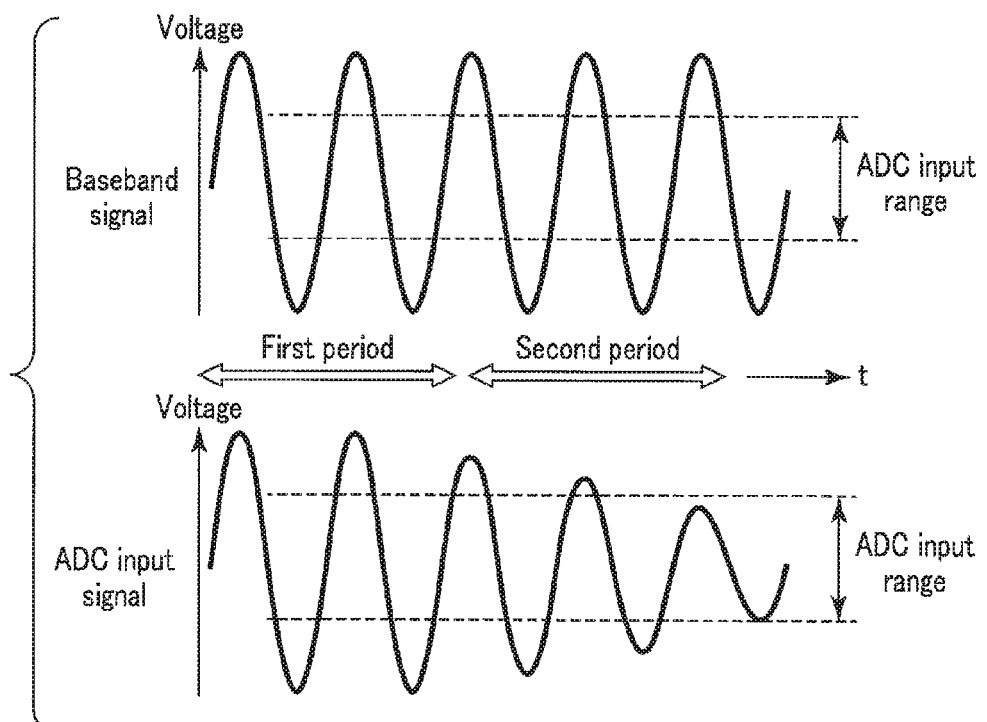
F I G. 2B

RECEIVER AND VOLTAGE CONTROLLED OSCILLATOR

CROSS-REFERENCE TO RELATED APPLICATIONS

This application is based upon and claims the benefit of priority from Japanese Patent Application No. 2014-254066, filed Dec. 16, 2014, the entire contents of which are incorporated herein by reference.

FIELD

Embodiments described herein relate generally to a receiver.

BACKGROUND

Conventionally, a typical baseband circuit in a receiver includes a variable gain amplifier (VGA) and an analog-to-digital converter (ADC). A VGA is used as a gain controller which adjusts an amplitude of a baseband signal to fall within a predetermined range (specifically, an input range of an ADC) by controlling a gain to be supplied to the baseband signal. An ADC converts a baseband signal in which the amplitude is adjusted by the VGA into a digital signal.

There is a baseband circuit structure to suppress power consumption of an ADC. The ADC generates an oscillation signal having a frequency controlled by a voltage value of a baseband signal, and generates a digital signal by performing frequency-to-digital conversion of the oscillation signal. However, in this procedure, a baseband signal in which the amplitude has been adjusted by a VGA is used.

However, power consumption of the VGA can be a problem for the baseband circuit. In addition, noise of the VGA is also added to the baseband signal.

BRIEF DESCRIPTION OF THE DRAWINGS

FIG. 1 is a block diagram illustrating a receiver according to the first embodiment.

FIG. 2A is a block diagram illustrating a receiver of a comparative example to the receiver according to the first embodiment.

FIG. 2B illustrates the operation of the receiver shown in FIG. 2A.

DETAILED DESCRIPTION

Figure 3:
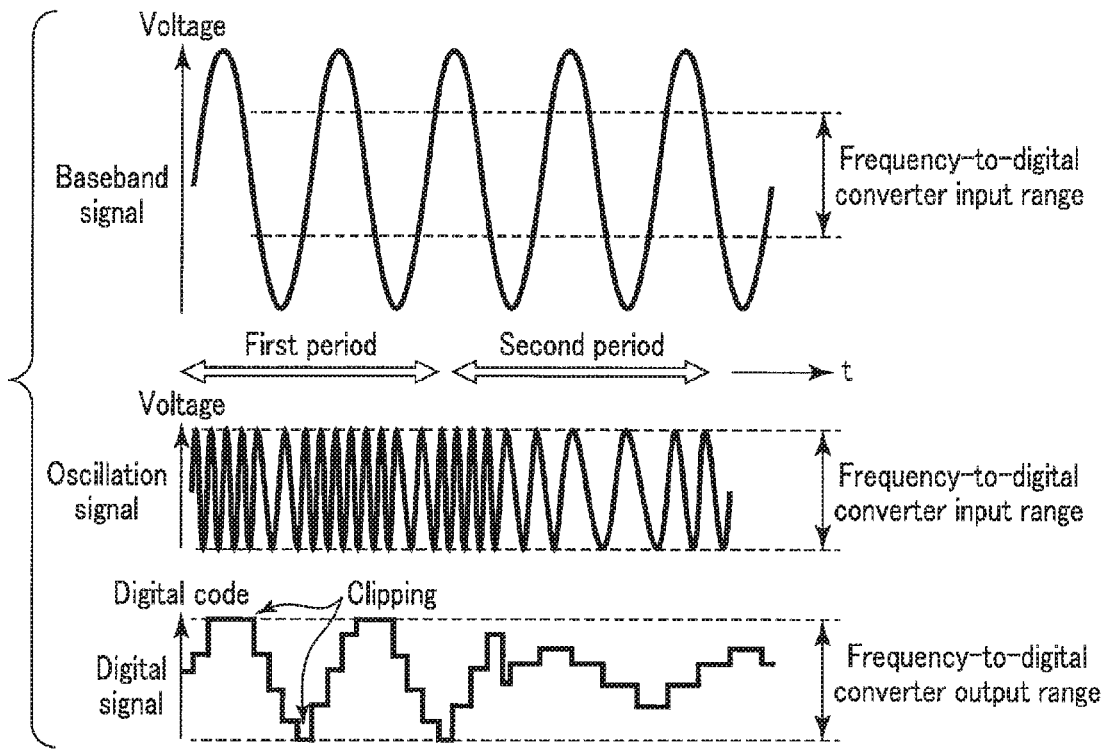
FIG. 3 illustrates the operation of the receiver shown in FIG. 1.

A description of the embodiments will now be given with reference to the accompanying drawings.

According to an embodiment, a receiver includes a voltage controlled oscillator, a frequency-to-digital converter and an input sensitivity controller. In the voltage controlled oscillator, input sensitivity relative to a baseband signal is controlled based on an input sensitivity control signal. The voltage controlled oscillator oscillates at a frequency controlled by a voltage of the baseband signal to generate an oscillation signal. The frequency-to-digital converter performs frequency-to-digital conversion of the oscillation signal to generate a digital signal. The input sensitivity controller generates the input sensitivity control signal based on the digital signal.

In the drawings, the same constituent elements are denoted by the same respective reference numbers, and redundant descriptions will be avoided.

First Embodiment

FIG. 2A illustrates a receiver of a comparative example a receiver according to the first embodiment. In the receiver including a VGA and an ADC shown in FIG. 2A, noise due to the VGA may be added to an input signal of the ADC.

The VGA, for example, reduces the amplitude of an input signal in accordance with an input range if the amplitude of the input signal exceeds the input range of the ADC. Specifically, as shown in FIG. 2B, the VGA compares the amplitude of a baseband signal (corresponding to an input signal of the VGA) and the input range of the ADC during a first period where the amplitude of the baseband signal is detected. The VGA reduces a gain of the VGA and outputs an ADC input signal in which the baseband signal is attenuated so that the amplitude thereof falls within the input range of the ADC, during a second period where the amplitude of the baseband signal is adjusted.

The receiver according to the first embodiment alternates the VGA with an alternative circuit that can reduce power consumption and prevent deterioration of a signal due to noise. Specifically, as shown in FIG. 1, a receiver 100 according to the first embodiment includes a voltage controlled oscillator (VCO) 110, a frequency-to-digital converter 120, and an input sensitivity controller 130. The receiver 100 generates an oscillation signal having a frequency controlled by a voltage value of a baseband signal (or an intermediate frequency signal) which is an analog signal, and generates a digital signal by performing frequency-to-digital conversion of the oscillation signal. That is, the receiver 100 performs analog-to-digital conversion.

The VCO 110 includes a first control terminal, a second control terminal, and an output terminal. The first control terminal of the VCO 110 is connected to a receiver circuit (not shown in the drawings) which processes an RF signal and a baseband signal. The second control terminal of the VCO 110 is connected to an output terminal of the input sensitivity controller 130. The output terminal of the VCO 110 is connected to an input terminal of the frequency-to-digital converter 120.

The VCO 110, for example, receives a baseband signal from the receiver circuit not shown in the drawings. The VCO 110 receives an input sensitivity control signal which controls input sensitivity of the VCO 110 relative to a baseband signal from the input sensitivity controller 130. The VCO 110 controls the input sensitivity based on the input sensitivity control signal, and generates an oscillation signal that oscillates at a frequency controlled by a voltage value of the baseband signal. The VCO 110 outputs the oscillation signal to the frequency-to-digital converter 120.

Figure 4:
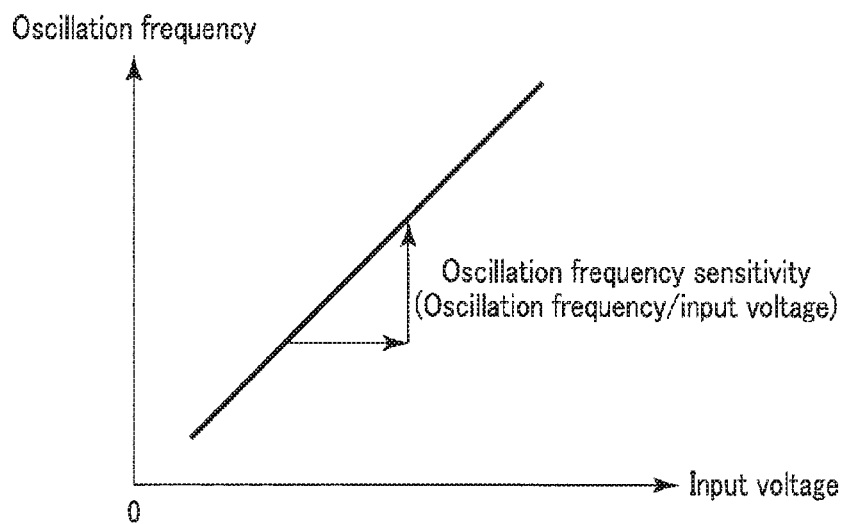
FIG. 4 is a graph illustrating the relationship between an input voltage and a WO oscillation frequency.

Specifically, the VCO 110 generates the oscillation signal from the baseband signal based on the relationship shown in the graph of FIG. 4. In the VCO 110, an oscillation frequency increases when an input voltage (i.e., voltage of baseband signal) is high, and the oscillation frequency decreases when the input voltage is low. The input sensitivity of the VCO 110 corresponds to the slope of the graph showing a change in the oscillation frequency relative to a change in input voltage (i.e., oscillation frequency sensitivity).

The frequency-to-digital converter 120 may be implemented by a time-to-digital converter (TDC), or a counter (e.g., frequency counter) etc. The frequency-to-digital converter 120 includes an input terminal, and an output terminal. The input terminal of the frequency-to-digital converter 120 is connected to the output terminal of the VCO 110. The output terminal of the frequency-to-digital converter 120 is connected to the input terminal of the input sensitivity controller 130 and a digital signal processing circuit which is not shown in the drawings.

The frequency-to-digital converter 120 receives an oscillation signal from the VCO 110. The frequency-to-digital converter 120 generates a digital signal by performing frequency-to-digital conversion of the oscillation signal. The frequency-to-digital converter 120 outputs the digital signal to the input sensitivity controller 130 and the digital signal processing circuit, which is not shown in the drawings.

The input sensitivity controller 130 includes an input terminal and an output terminal. The input terminal of the input sensitivity controller 130 is connected to the output terminal of the frequency-to-digital converter 120. The output terminal of the input sensitivity controller 130 is connected to the second control terminal of the VCO 110.

The input sensitivity controller 130 receives the digital signal from the frequency-to-digital converter 120. The input sensitivity controller 130 generates an input sensitivity control signal that controls the input sensitivity of the VCO 110 based on the digital signal. The input sensitivity controller 130 outputs the input sensitivity control signal to the VCO 110.

For example, the input sensitivity controller 130 may control the input sensitivity in accordance with the following technique: During a first period where the amplitude of a digital signal is detected, the input sensitivity controller 130 compares a mean-square code of the digital signal obtained during a certain unit of a period with a first threshold and a second threshold (first threshold>second threshold). When the mean-square code of the digital signal exceeds the first threshold, or falls below the second threshold, the input sensitivity controller 130 generates an input sensitivity control signal to decrease the input sensitivity during a second period where the input sensitivity of the VCO 110 is adjusted. Otherwise, when clipping of the digital signal is detected (i.e., the condition where the digital signal reaches the upper limit or lower limit of an output range of the frequency-to-digital converter 12), the input sensitivity controller 130 generates an input sensitivity control signal to decrease the input sensitivity.

The receiver 100 operates in such a manner as is illustrated in FIG. 3. FIG. 3 shows the case where the oscillation frequency of an oscillation signal which depends on the amplitude of a baseband signal exceeds a predetermined value (i.e., the upper and lower frequency limits that can be converted by the frequency-to-digital converter 120). During the first period where the amplitude of a digital signal is detected, the input sensitivity controller 130 detects clipping of a digital signal. During the second period where the input sensitivity of the VCO 110 is adjusted, the input sensitivity controller 130 generates an input sensitivity control signal to decrease the input sensitivity based on the detection result in the first period, and outputs the input sensitivity control signal to the VCO 110. Since the input, sensitivity decreases in accordance with the input sensitivity control signal, the VCO 110 outputs an oscillation signal having an oscillation frequency not exceeding the predetermined value to the frequency-to-digital converter 120.

As explained above, the receiver according to the first embodiment includes the VCO, the frequency-to-digital converter, and the input sensitivity controller. The VCO controls the input sensitivity relative to a baseband signal based on an input sensitivity control signal. The VCO generates an oscillation signal that oscillates at the frequency controlled by the voltage value of the baseband signal. The frequency-to-digital converter generates a digital signal by performing frequency-to-digital conversion of the oscillation signal. The input sensitivity controller generates an input sensitivity control signal based on the digital signal.

Direct current does not flow in passive elements included in the VCO, therefore power consumption is low, and only thermal noise is generated. Accordingly, a digital signal with low noise can be generated by increasing the sensitivity for a faint input signal. In addition, there is no need for amplifying a baseband signal with an amplifier. Accordingly, there is no need for flicker noise reduction of the amplifier, and low noise properties can be maintained for an input signal in the low frequency band. Therefore, the receiver can reduce power consumption in comparison with the receiver using the VGA, and prevent deterioration of the digital signal due to noise.

Second Embodiment

Figure 5:
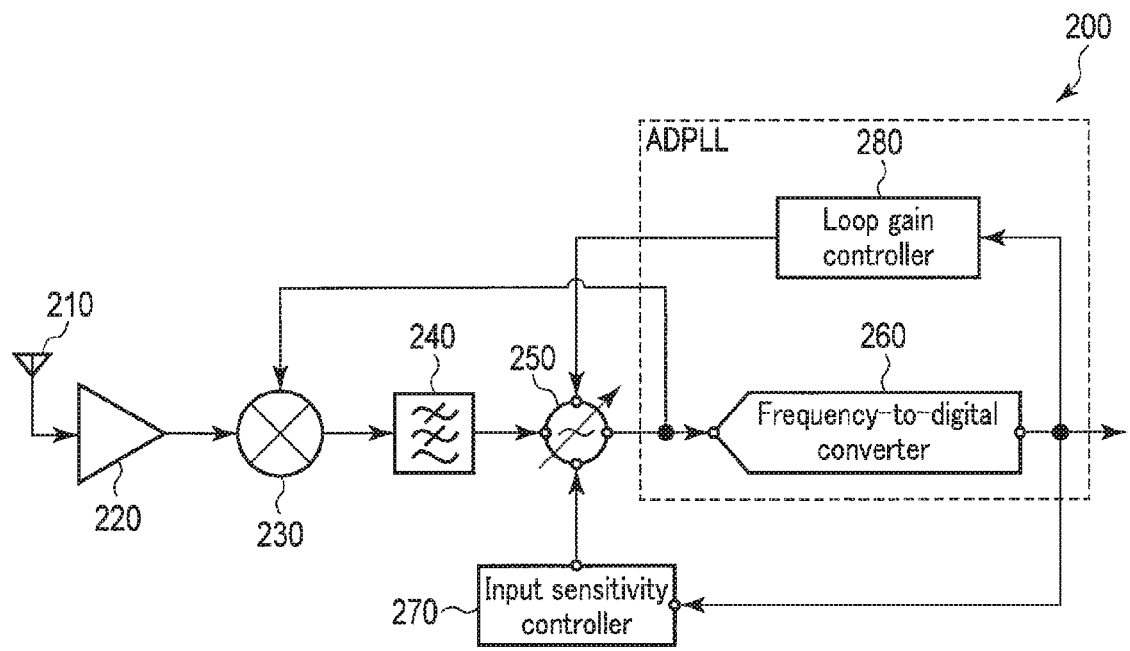
FIG. 5 is a block diagram illustrating a receiver according to the second embodiment.

As shown in FIG. 5, a receiver 200 according to the second embodiment includes an antenna 210, a low noise amplifier (LNA) 220, a mixer 230, a low-pass filter (LPF) 240, a VCO 250, a frequency-to-digital converter 260, an input sensitivity controller 270, and a loop gain controller 280.

The antenna 210 receives a radio frequency (RF) signal. The antenna 210 outputs the RF signal to the LNA 220.

The LNA 220 receives an RF signal from the antenna 210. The LNA 220 generates an amplified RF signal by performing low noise amplification to the RF signal. The antenna 220 outputs the amplified RF signal to the mixer 230.

The mixer 230 receives the amplified RF signal from the LNA 220. The mixer 230 receives an oscillation signal from the VCO 250. The mixer 230 down-converts the amplified RF signal by using the oscillation signal (i.e., multiplying the amplified RF signal by the oscillation signal) to generate a product signal. The mixer 230 outputs the product signal to the LPF 240.

The LPF 240 receives the product signal from the mixer 230. The LPF 240 generates a baseband signal or an intermediate frequency signal) by suppressing the high frequency component of the product signal. For example, the LPF 240 generates the baseband signal by removing an interfering component existing in adjacent frequency bands and an unnecessary signal outside the baseband included in the product signal. The LPF 240 outputs the baseband signal to the VCO 250.

The VCO 250 includes a first control terminal, a second control terminal, a third control terminal, and an output terminal. The first control terminal of the VCO 250 is connected to the LPF 240. The second control terminal of the VCO 250 is connected to the loop gain controller 280. The third control terminal of the VCO 250 connected to an output terminal of the input sensitivity controller 270. The output terminal of the VCO 250 is connected to each of the mixer 230 and an input terminal of the frequency-to-digital converter 260.

The VCO 250 receives a baseband signal from the LPF 240. The VCO 250 receives an input sensitivity control signal that controls input sensitivity of the VCO 250 relative to a baseband signal from the input sensitivity controller 270. The VCO 250 controls the input sensitivity based on the input sensitivity control signal, and generates an oscillation signal that oscillates at a frequency controlled by a voltage value of the baseband signal.

The VCO 250 also receives a frequency control signal that controls the oscillation frequency from the loop gain controller 280. The frequency control signal is generated to eliminate a transient change in the oscillation frequency caused by a baseband signal, and corresponds to an inverse phase signal of the baseband signal. The oscillation frequency of the VCO 250 is maintained fairly stable by the frequency control signal from the loop gain controller 280 regardless of the transient change due to the baseband signal. The VCO 250 outputs the oscillation signal to each of the mixer 230 and the frequency-to-digital converter 260.

The frequency-to-digital converter 260 may be implemented by a TDC or a counter (e.g., frequency counter) etc. The frequency-to-digital converter 260 includes an input terminal and an output terminal. The input terminal of the frequency-to-digital converter 260 is connected to the output terminal of the VCO 250. The output terminal of the frequency-to-digital converter 260 is connected to each of the input terminal of the input sensitivity controller 270, the loop gain controller 280, and a digital signal processing circuit not shown in the drawings.

The frequency-to-digital converter 260 receives an oscillation signal from the VCO 250. The frequency-to-digital converter 260 generates a digital signal by performing frequency-to-digital conversion of the oscillation signal. The frequency-to-digital converter 260 outputs the digital signal to each of the input sensitivity controller 270, the loop gain controller 280, and the digital signal processing circuit not shown in the drawings.

The input sensitivity controller 270 includes an input terminal and an output terminal. The input terminal of the input sensitivity controller 270 is connected to the output terminal of the frequency-to-digital converter 260. The output terminal of the input sensitivity controller 270 is connected to the third control terminal of the VCO 250.

The input sensitivity controller 270 receives a digital signal from the frequency-to-digital converter 260. The input sensitivity controller 270 generates an input sensitivity control signal that controls the input sensitivity of the VCO 250 based on the digital signal. The input sensitivity controller 270 outputs the input sensitivity control signal to the VCO 250. The operation of the input sensitivity controller is similar to that explained in the first embodiment, and the explanation thereof is omitted.

The loop gain controller 280 may be formed of a circuit including an integrator. The loop gain controller 280 receives a digital signal from the frequency-to-digital converter 260. The loop gain controller 280 forms an all digital phase-locked loop (ADPLL) with the frequency-to-digital converter 260. The loop gain controller 280 generates a frequency control signal corresponding to an inverse phase signal of a baseband signal by using the digital signal. The loop gain controller 280 outputs the frequency control signal to the VCO 250. The general operation can be applied for the ADPLL, and the explanation thereof is omitted.

To sum up, the receiver 200 performs the following operation: At the VCO 250, the frequency of an oscillation signal transiently changes (i.e., increases or decreases) if a baseband signal is input. The frequency-to-digital converter 260 generates a digital signal by performing frequency-to-digital conversion of the oscillation signal. The loop gain controller 280 generates a frequency control signal corresponding to an inverse phase signal of the baseband signal. The oscillation frequency of the VCO 250 is returned to the value before the baseband signal is input, by a looped-back frequency control signal. Since the change in the oscillation frequency of the VCO 250 is transient, the mixer 230 can down-convert the baseband signal by using an oscillation signal as a local signal. The operation of the input sensitivity controller 270 is similar to that explained in the first embodiment, and the explanation thereof is omitted.

As explained above, the receiver according to the second embodiment includes the VCO, the frequency-to-digital converter, and the input sensitivity controller, explained in the first embodiment. Therefore, the receiver can reduce power consumption in comparison with the receiver using the VGA, and can prevent deterioration of the digital signal due to noise.

Third Embodiment

Figure 6:
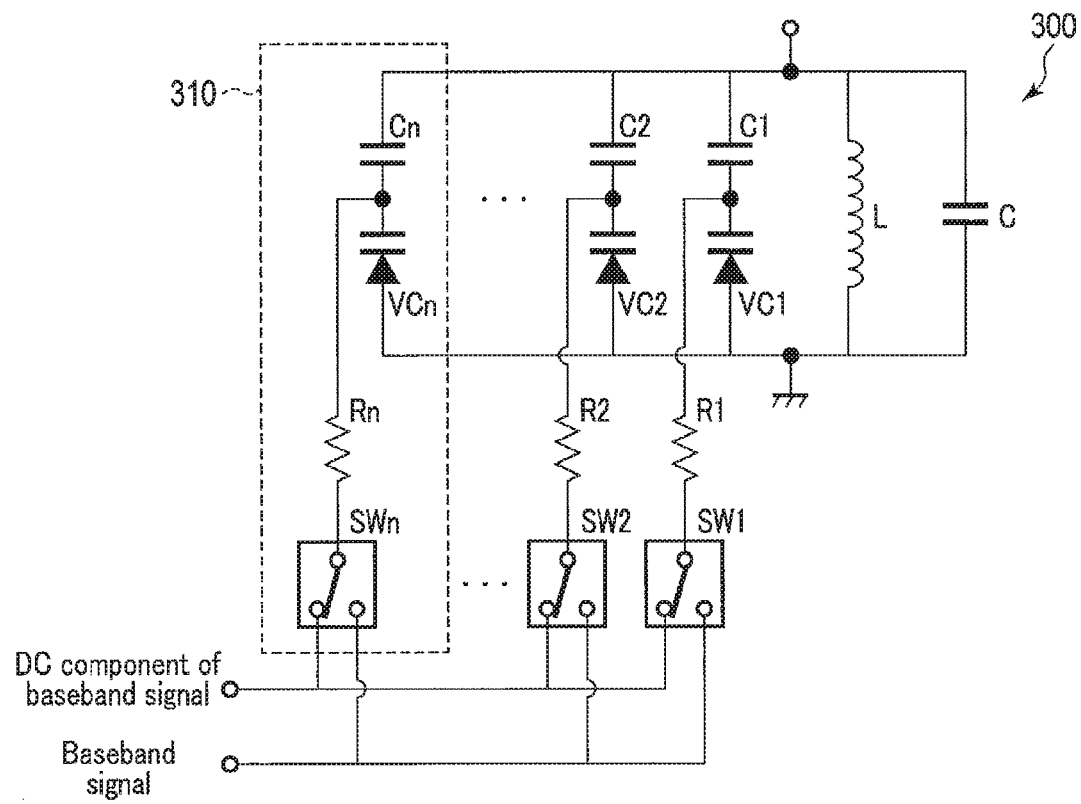
FIG. 6 is a block diagram illustrating a voltage controlled oscillator according to the third embodiment.

As shown in FIG. 6, a voltage controlled oscillator 300 according to the third embodiment includes a capacitor C, an inductor L, and n circuits 310-1, 310-2, . . . , 310-$n$ (n is an integer equal or greater than two). An oscillator shown in FIG. 6 may adjust an input sensitivity by the operation of the n circuits 310. In FIG. 6, n×3; however, n may be two or an integer equal to or greater than four.

The capacitor C is connected in parallel with the inductor L and capacitors Ci that are respectively connected in series with variable capacitance diodes VCi (also referred to as varactor diodes) (i is an integer equal to or greater than one) included in the circuits 310-$i$. A first end of the capacitor C is connected to a first end of the inductor L, a first end of each capacitor Ci, and a signal amplification circuit not shown in the drawings. A second end of the capacitor C is connected to a second end of the inductor L, and a second end of each varactor diode VCi, and is grounded.

The first end of the inductor L is connected to the first end of the capacitor C, the first end of each capacitor Ci, and the signal amplification circuit not shown in the drawings. The second end of the inductor L is connected to the second end of the capacitor C, and the second end of each varactor diode VCi, and is grounded.

The circuit 310-$i$ includes a switch SWi, a resistor Ri, a capacitor Ci, and a varactor diode VCi.

The switch SWi includes a first input terminal and a second input terminal. The first input terminal of the switch SWi is connected to a direct current generation circuit not shown in the drawings. The second input terminal of the switch SWi is connected to a receiver circuit not shown in the drawings. An output terminal of the switch SWi is connected to a second end of the resistor Ri.

The switch SWi inputs a direct current (DC) voltage of a baseband signal from the direct current generation circuit not shown in the drawings. The switch SWi inputs a baseband signal (i.e., alternating current (AC) voltage and DC voltage) from the receiver circuit not shown in the drawings. The switch SWi selects one of the baseband signal or DC voltage of the baseband signal as an output voltage in accordance with an input sensitivity control signal. The switch SWi outputs the output voltage to the resistor Ri.

The first end of the resistor Ri is connected to the second end of the capacitor Ci and the first end of the varactor diode VCi. The second end of the resistor Ri is connected to the output terminal of the switch SWi.

The capacitors Ci may be formed to have the same capacitance, or to have different capacitances. The first end of the capacitor Ci is connected to the first ends of the capacitor C and the inductor L, and the signal amplification circuit not shown in the drawings. The second end of the capacitor Ci is connected to the first end of the varactor diode VCi and the first end of the resistor Ri.

The capacitor Ci receives voltage from the switch SWi through the resistor Ri.

The varactor diodes VCi may have the same properties (e.g., rate of capacitance change), or may have different properties. The first end of the varactor diode VCi is connected to the second end of the capacitors Ci and the first end of the resistor Ri. The second ends of the varactor diode VCi is connected to the second ends of the capacitor C and the inductor L, and is grounded.

The varactor diode VCi receives voltage from the switch SWi through the resistor Ri. The varactor diode VCi acts as a variable capacitor if the capacitance between electrodes is changed by the applied voltage. Specifically, the capacitance of the varactor diode VCi becomes smaller as the applied voltage is higher, and becomes greater as the applied voltage is lower.

The voltage controlled oscillator 300 corresponds to an LC resonator in which an oscillation frequency is determined based on the total capacitance of the capacitor C, capacitor Ci, and varactor diodes VCi, and the inductance of the inductor L. For example, if a DC component of a baseband signal is applied to all of the varactor diodes VCi, the total capacitance is fixed. On the other hand, if an AC component and a DC component of a baseband signal is applied, the total capacitance varies, centered at a fixed value. In other words, the oscillation frequency of the voltage controlled oscillator 300 varies with the fixed value of a baseband signal set as a center according to the DC component, in accordance with the AC component of the baseband signal.

Figure 7:
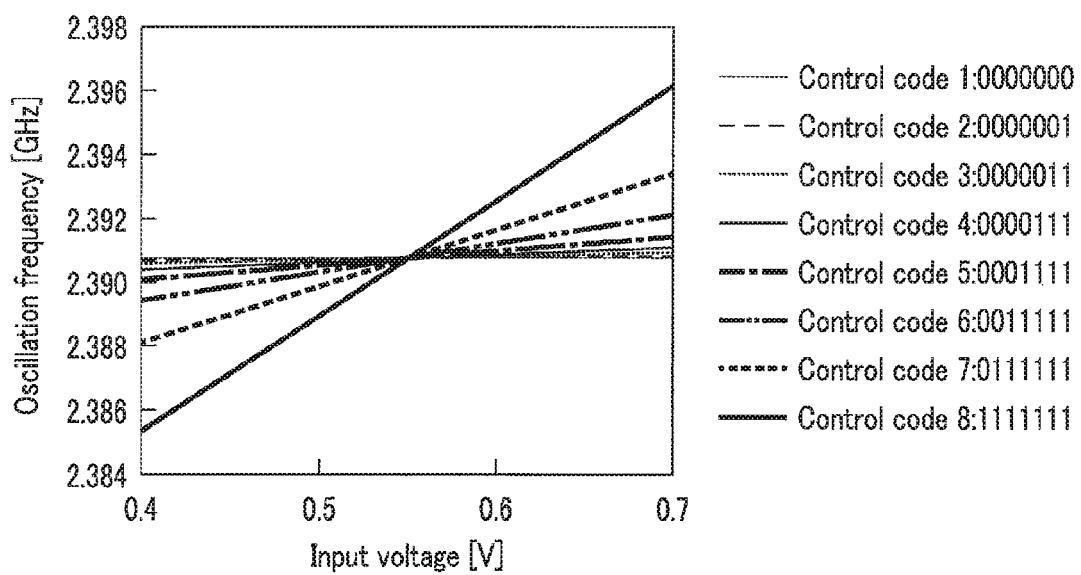
FIG. 7 illustrates the operation of the voltage controlled oscillator shown in FIG. 6.

FIG. 7 illustrates the relationship between the oscillation frequency and the input voltage for each input sensitivity control signal in the voltage controlled oscillator 300. An input sensitivity control signal is an n bit control code, for example, and the $i^{th}$ bit is set to be "0" or "1", according to the selection of the input terminal of the switch SWi. The control code "0" represents selection of the first input terminal (i.e., a DC component of a baseband signal), and the control code "1" represents selection of the second input terminal (i.e., an AC component and a DC component of a baseband signal). Accordingly, if all the varactor diodes VCi have the same property, the input sensitivity of the voltage controlled oscillator 300 becomes higher as the number of control codes "1" increases, and becomes lower as the number of control codes "0" increases. Thus, the voltage controlled oscillator 300 may set a desired input sensitivity by controlling each of the switches SWi by an input sensitivity control signal.

Furthermore, the voltage controlled oscillator 300 oscillates at a fixed frequency regardless of the input sensitivity if a voltage of a baseband signal exhibits a predetermined voltage value. In FIG. 7, if an input voltage is 0.55 V, the oscillation frequency is set to be a fixed value. That is, the input sensitivity of the voltage controlled oscillator 300 varies to be centered at the fixed frequency by switching the control code.

As explained above, the voltage controlled oscillator according to the third embodiment includes a plurality of varactor diodes and a plurality of switches. The plurality of varactor diodes vary in capacitance based on the applied voltage. The plurality of switches respectively supply a baseband signal or a DC component of the baseband signal to the first ends of the varactor diodes, in accordance with an input sensitivity control signal. That is, the voltage controlled oscillator selects a baseband signal or a DC component of the baseband signal for each switch and controls the voltage to be applied to the plurality of varactor diodes to set a desired input sensitivity.

In addition, the voltage controlled oscillator oscillates at a fixed frequency regardless of the input sensitivity if a voltage of the baseband signal exhibits a predetermined voltage value. Accordingly, the voltage controlled oscillator does not change a centered value of the oscillation frequency even if the input sensitivity is changed. For example, the ADPLL may have a problem of losing lock due to an abrupt change in the oscillation frequency. However, in accordance with this voltage controlled oscillator, since the centered value of the oscillation frequency does not vary even if the input sensitivity is changed, lock of the ADPLL is not easily lost, thereby achieving stable operation. Therefore, the voltage controlled oscillator is suitable for the receiver of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A receiver comprising:
a voltage controlled oscillator in which input sensitivity relative to a baseband signal is controlled based on an input sensitivity control signal, and that oscillates at a frequency controlled by a voltage of the baseband signal to generate an oscillation signal;
a frequency-to-digital converter that performs frequency-to-digital conversion of the oscillation signal to generate a digital signal; and
an input sensitivity controller that generates the input sensitivity control signal based on the digital signal.

2. The receiver according to claim 1, wherein the input sensitivity controller compares a mean-square code of the digital signal with at least one threshold, and generates the input sensitivity control signal based on a comparison result.

3. The receiver according to claim 2, wherein when the mean-square code of the digital signal exceeds a first threshold, or falls below a second threshold that is smaller than the first threshold, the input sensitivity controller generates the input sensitivity control signal to decrease the input sensitivity.

4. The receiver according to claim 1, wherein the input sensitivity controller generates the input sensitivity control signal to decrease the input sensitivity when detecting clipping of the digital signal.

5. The receiver according to claim 1, further comprising:
a low noise amplifier that performs low noise amplification of a radio frequency signal to generate an amplified signal;
a mixer that multiplies the amplified signal by the oscillation signal to generate a product signal;

a low-pass filter that suppresses a high frequency component in the product signal to generate the baseband signal; and a loop gain controller that generates a frequency control signal corresponding to an inverse phase signal of the baseband signal by using the digital signal, wherein the voltage controlled oscillator controls a frequency of the oscillation signal by the frequency control signal in addition to the voltage of the baseband signal.

6. The receiver according to claim 1, wherein the voltage controlled oscillator comprises:

a plurality of varactor diodes; and a plurality of switches that switches voltages to be applied to the plurality of varactor diodes in accordance with the input sensitivity control signal.

7. The receiver according to claim 6, wherein the plurality of switches respectively select the baseband signal or a DC component of the baseband signal in accordance with the input sensitivity control signal, and supply the selected signals to one ends of the plurality of varactor diodes.

8. The receiver according to claim 1, wherein the voltage controlled oscillator oscillates at a fixed frequency regardless of the input sensitivity if a voltage of the baseband signal equals a predetermined voltage value.

* * * * *